(12) United States Patent
Tsai et al.

(10) Patent No.: US 12,189,954 B2
(45) Date of Patent: Jan. 7, 2025

(54) COMPUTER SYSTEM, MEMORY DEVICE FORMED ON A WAFER ON WAFER STACK IN THE COMPUTER SYSTEM AND MEMORY CONTROL METHOD APPLIED TO THE COMPUTER SYSTEM BASED ON WAFER-ON-WAFER ARCHITECTURE

(71) Applicant: WHALECHIP CO., LTD., Taipei (TW)

(72) Inventors: Kun-Hua Tsai, Taipei (TW); Yi-Wei Yan, Taipei (TW)

(73) Assignee: WHALECHIP CO., LTD., Taipei (TW)

( * ) Notice: Subject to any disclaimer, the term of this patent is extended or adjusted under 35 U.S.C. 154(b) by 114 days.

(21) Appl. No.: 17/960,139

(22) Filed: Oct. 5, 2022

(65) Prior Publication Data
US 2023/0125009 A1 Apr. 20, 2023

(30) Foreign Application Priority Data
Oct. 20, 2021 (TW) .................................. 110138931

(51) Int. Cl.
*G11C 5/04* (2006.01)
*G06F 3/06* (2006.01)
(Continued)

(52) U.S. Cl.
CPC .......... *G06F 3/0611* (2013.01); *G06F 3/0629* (2013.01); *G06F 3/0683* (2013.01);
(Continued)

(58) Field of Classification Search
CPC .. G06F 3/0611; G06F 3/0629; G11C 11/4076; G11C 11/4087; G11C 11/4094; G11C 2207/2272; H01L 24/08; H01L 25/0657; H01L 2924/1436; H01L 25/50; H01L 27/0688
See application file for complete search history.

(56) References Cited

U.S. PATENT DOCUMENTS 5,636,174 A * 6/1997 Rao ........................ G11C 11/408
365/207
8,072,790 B2 12/2011 Kim
(Continued)

FOREIGN PATENT DOCUMENTS

TW M623357 U 2/2022

*Primary Examiner* — Mushfique Siddique

(57) ABSTRACT

A computer system based on wafer-on-wafer architecture is provided, comprising a memory device and a logic circuit layer stacked in a wafer on wafer structural configuration. The memory device comprises a memory array and a circuit driver. The memory array comprises a shared circuit path and a plurality of memory cells, wherein the shared circuit path is connected to the memory cells. The circuit driver is connected to the shared circuit path, driving the memory cells. The logic circuit layer comprises a plurality of bonding pads for signal transmission, and a latency controller, connected to the memory array through the bonding pads, adjusting the number of memory cells connecting the shared circuit path, thereby dynamically adjusting the latency characteristics of the memory array. Embodiments of the memory device and the memory control method are also provided.

11 Claims, 10 Drawing Sheets

(51) Int. Cl.
- *G11C 5/02* (2006.01)
- *G11C 11/4076* (2006.01)
- *G11C 11/408* (2006.01)
- *G11C 11/4094* (2006.01)
- *H01L 23/00* (2006.01)
- *H01L 25/065* (2023.01)
- *H01L 25/18* (2023.01)

(52) U.S. Cl.
CPC ............... *G11C 5/025* (2013.01); *G11C 5/04* (2013.01); *G11C 11/4076* (2013.01); *G11C 11/4087* (2013.01); *G11C 11/4094* (2013.01); *H01L 24/08* (2013.01); *H01L 25/0657* (2013.01); *H01L 25/18* (2013.01); *G11C 2207/2272* (2013.01); *H01L 2224/08145* (2013.01); *H01L 2924/1431* (2013.01); *H01L 2924/1436* (2013.01)

(56) References Cited

U.S. PATENT DOCUMENTS

| | | | | |
|---|---|---|---|---|
| 2009/0161401 A1* | 6/2009 | Bilger | ............... | G11C 13/0023 |
| | | | | 365/230.03 |
| 2010/0091537 A1* | 4/2010 | Best | ............ | G11C 5/025 |
| | | | | 365/220 |
| 2013/0044550 A1* | 2/2013 | Jung | ............ | G11C 5/025 |
| | | | | 365/189.02 |
| 2021/0011645 A1* | 1/2021 | Martinelli | ............ | G11C 29/806 |
| 2021/0012817 A1* | 1/2021 | Laurent | ............... | G11C 7/12 |
| 2021/0313288 A1 | 10/2021 | Oh | | |
| 2022/0199137 A1* | 6/2022 | Martinelli | ............... | G11C 29/74 |

* cited by examiner

COMPUTER SYSTEM, MEMORY DEVICE FORMED ON A WAFER ON WAFER STACK IN THE COMPUTER SYSTEM AND MEMORY CONTROL METHOD APPLIED TO THE COMPUTER SYSTEM BASED ON WAFER-ON-WAFER ARCHITECTURE

CROSS-REFERENCE TO RELATED APPLICATION

This application claims the priority benefit of Taiwanese Patent Application Serial Number 110138931, filed on Oct. 20, 2021, the full disclosure of which is incorporated herein by reference.

BACKGROUND

Technical Field

The present disclosure relates to the technical field of memory device, particularly to a memory architecture that can change the latency characteristics according to application requirements, and a computer system implemented by applying the memory architecture and wafer stacking technology.

Related Art

The application of artificial intelligence and blockchain has become a brand new business opportunity nowadays, where the blockchain can be widely used in smart contracts, digital identity, sharing economy, and other applications.

However, the algorithm of the blockchain is often changed on some of the blockchain platforms for security considerations or bug fixes. In addition to increasing the difficulty of computing, special designs are often deliberately made to reduce the computing efficiency of specific application wafers (ASICs). For example, the requirement to increase the memory throughput, or the capacity requirement of the storage device.

For developers of the blockchain server, the hardware architecture should be changed to adapt to the changes in the blockchain algorithm. However, the algorithms proposed by these crowdfunding platforms may be constantly updated. Thus, enabling the hardware of the same set of blockchain servers flexibly change parameters to adapt to new algorithms is yet to be developed.

SUMMARY

The embodiments of the present disclosure provide a computer system that can flexibly adapt to the requirements of the changing of the blockchain algorithm. In an embodiment of a computer system, a wafer on wafer technology is applied, so that the wafer where the memory device is disposed and the wafer of the core logic circuit are stacked into a three-dimensional structural configuration. This approach allows no extra area between the two wafers, and thousands of bonding pads can be used directly as signal transmission paths. Since the number of transmission lines is no longer limited by designing only in a plane, a large number of dedicated wires can be used to solve the performance issue of data transmission.

The memory device of the present disclosure is disposed on a layer of wafer dedicated to the memory, which may comprise a plurality of memory arrays (BANK). Each of the memory arrays mainly comprises a shared circuit path and a plurality of memory cells. The shared circuit path may be a representative name of a data line or an address line in this embodiment, and each shared circuit path is correspondingly connected to one row or one column of the memory cells. The memory unit refers to a basic unit for storing bit information, which is usually activated under the control of an address signal to read or write under the control of the data signal.

The memory device further comprises a line driver connected to the shared circuit path for driving the memory cells. The line driver could be an alternative name for data driver or address decoder.

As mentioned above, the computer system comprises a logic circuit layer combined with the memory crystal layer to form a wafer on wafer configuration, which comprises a plurality of bonding pads for signal transmission.

A latency controller is disposed in the logic circuit layer of the computer system of the present disclosure, which is connected to the memory array through the bonding pads. The purpose of such configuration is to flexibly adjust the number of memory cells connected to the shared circuit path for dynamically changing the characteristic of latency of the memory array.

In further embodiments, a plurality of multiplexers (MUXs) are disposed in each memory array. Each of the multiplexers is separated by a specific number of rows or columns of space. These multiplexers define a memory array as a plurality of memory regions, each of which comprises a specific number of rows or columns of memory cells. In other words, a multiplexer is disposed adjacent to every two memory regions and is connected to the line driver by a dedicated line.

When the latency controller transmits a control signal through a bonding pad to activate a multiplexer, the shared circuit path would be segmented into a first line segment and a second line segment, and the second line segment would be connected to the dedicated line.

Since the shared circuit path is originally connected to a plurality of memory cells in series, after being segmented into two line segments, two sub-arrays would be logically formed. In other words, a memory region corresponding to the first line segment forms a first sub-array, and a memory region corresponding to the second line segment forms a second sub-array. For implementation and management, the segmentation in this embodiment may be bisection. Thus, a memory array can be equally segmented into two sub-arrays in equal size, which can be further segmented into four with more multiplexers, and so on.

In a specific embodiment, the way of changing the dimension of the memory array, that is, the way of forming the sub-array, could be the segmentation of the shared data line into two shorter data lines. The line driver comprises a data driver. The shared circuit path here represents one or more shared data lines, each of the shared data lines is connected to the data driver, and a row of memory cells corresponds to the memory cells for transmitting data signals of the memory cells. When the multiplexer is activated, since the shared data line is segmented, the second sub-array would no longer share the shared data line of the first sub-array. Instead, a dedicated line is additionally provided by the multiplexer to transmit data signals to the memory cells in the second sub-array. This approach would allow the number of memory cells on a shared circuit path to be reduced, which in turn could reduce capacitive loading and speed up data-driven response times.

As for the second sub-array, since the data line is connected to the data driver by a dedicated line, it would independently receive different data signal sources, which would also have low-loading and high-speed performance. Furthermore, the address lines of the second sub-array can be changed to share the address lines of the first sub-array. In this way, the original memory array dimension is changed, the number of data lines (array width) is doubled, and the number of address lines (array height) is halved. The memory device initially comprises a plurality of shared address lines, each of the shared address lines is connected to the address decoder and a corresponding column of memory cells among the memory cells for transmitting address signals of the memory cells. The line driver comprises an address decoder connecting each column of memory cells in the memory array through the shared address lines. In fact, when the multiplexer is activated, according to the control signal, the address decoder would allow the memory cells in the second sub-array to share the shared address lines of the first sub-array, and would use the same address signal to drive the first sub-array and the second sub-array synchronously. In other words, the shared address lines having corresponding columns in the second sub-array and in the first sub-array are made to receive the same address signal.

In another specific embodiment, the way of changing the dimension of the memory array, that is, the way of forming the sub-array, may also the segmentation of the shared address line into two shorter address lines. In this case, the above-mentioned shared circuit paths represent one or more shared address lines for transmitting address signals of the memory cells. When the multiplexer is activated, the memory cells in the second sub-array would use the dedicated line to transmit address signals. Meanwhile, according to the control signal, the address decoder would allow the memory cells in the second sub-array to share the shared data line of the first sub-array, and would use the same data signal to drive the first sub-array and the second sub-array. Since the memory cells in the second sub-array use different address lines from those in the first sub-array, the memory array dimension is equivalent to halving the number of data bits (array width) and doubling the number of address lines (array height).

In a further embodiment, the logic circuit layer further comprises a memory controller coupled to the memory array through the bonding pads. A core is connected to the memory controller and the latency controller for performing an application. The core could set the multiplexers in the memory array through the latency controller according to an application condition required by the application so that the dimensions of the memory array can be changed, that is, divided into multi-power subarrays of two, and then reorganized into new array dimensions that meet the conditions of the application. When executing the application, the core can use the reconfigured memory array through the memory controller.

In a further embodiment, the application condition includes a response time required by the application. In the embodiment of segmenting the data line, the greater the number of multiplexers activated by the latency controller, the shorter the response time of the new memory array would be formed.

The present disclosure further provides a memory control method, which is applied to the aforementioned computer system and memory device. When an application is executed by a core, according to an application condition required by the application, the core would set the multiplexers in the memory array through the latency controller, so that the memory array can be segmented into two or more sub-arrays that meet the application condition, and can use the memory sub-arrays through the memory controller when executing the application.

Based on the wafer stacking technology, the present disclosure provides a memory architecture that can flexibly adjust the dimensions of the array, so that the blockchain server product would have the ability to adapt to the requirements for future algorithms.

It should be understood, however, that this summary may not contain all aspects and embodiments of the present disclosure, that this summary is not meant to be limiting or restrictive in any manner, and that the disclosure as disclosed herein will be understood by one of ordinary skill in the art to encompass obvious improvements and modifications thereto.

BRIEF DESCRIPTION OF THE DRAWINGS

The features of the exemplary embodiments believed to be novel and the elements and/or the steps characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION OF THE EMBODIMENTS

The present disclosure will now be described more fully hereinafter with reference to the accompanying drawings, in which exemplary embodiments of the disclosure are shown. This present disclosure may, however, be embodied in many different forms and should not be construed as limited to the embodiments set forth herein. Rather, these embodiments are provided so that this present disclosure will be thorough and complete, and will fully convey the scope of the present disclosure to those skilled in the art.

Certain terms are used throughout the description and following claims to refer to particular components. As one skilled in the art will appreciate, manufacturers may refer to a component by different names. This document does not intend to distinguish between components that differ in name but function. In the following description and in the claims, the terms "include/including" and "comprise/comprising" are used in an open-ended fashion, and thus should be interpreted as "including but not limited to". "Substantial/substantially" means, within an acceptable error range, the person skilled in the art may solve the technical problem in a certain error range to achieve the basic technical effect.

The following description is of the best-contemplated mode of carrying out the disclosure. This description is made for the purpose of illustration of the general principles of the disclosure and should not be taken in a limiting sense. The scope of the disclosure is best determined by reference to the appended claims.

Moreover, the terms "include", "contain", and any variation thereof are intended to cover a non-exclusive inclusion. Therefore, a process, method, object, or device that includes a series of elements not only includes these elements, but also includes other elements not specified expressly, or may include inherent elements of the process, method, object, or device. If no more limitations are made, an element limited by "include a/an . . . " does not exclude other same elements existing in the process, the method, the article, or the device which includes the element.

Figure 1:
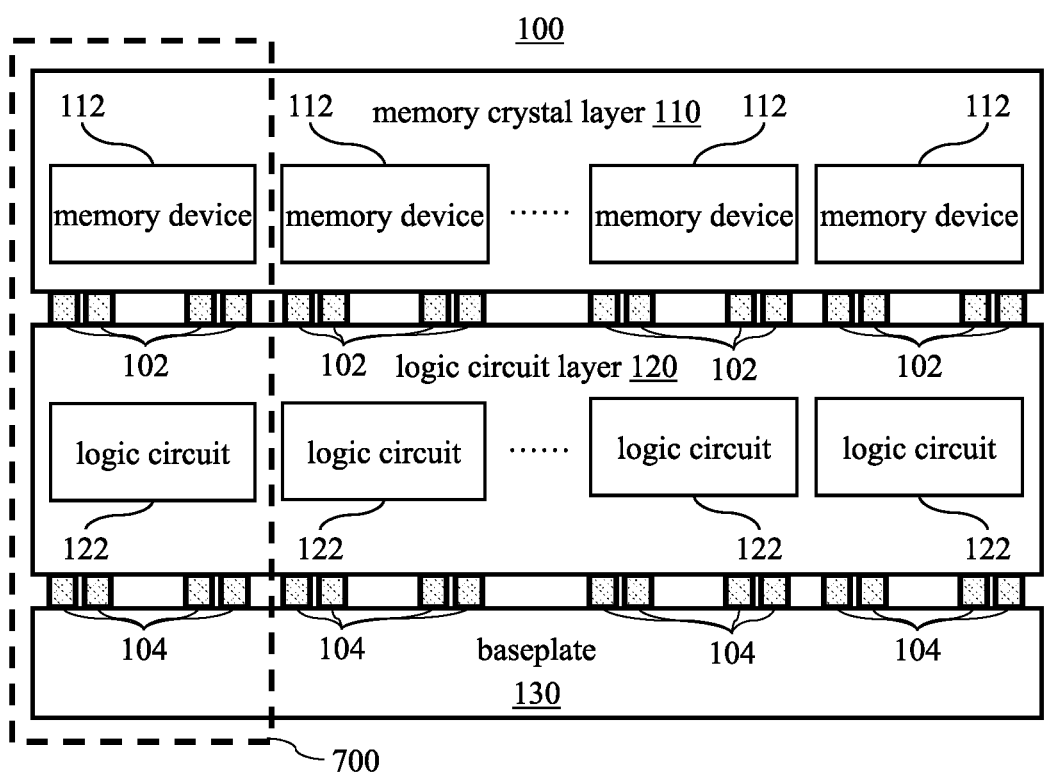
FIG. 1 is an embodiment of a computer system of the present disclosure.

FIG. 1 is an embodiment of a computer system of the present disclosure. A three-dimensional wafer product 100 is formed of at least a memory crystal layer 110, a logic circuit layer 120, and a baseplate 130 through a layer by layer stacking. In addition to providing basic support, the baseplate 130 also provides additional wiring space. A plurality of bonding pads 102 or 104 are disposed between the layers to provide signal channels. In this embodiment, the three-dimensional wafer product 100 is a semi-finished product of the computer system 700, and after dicing, a plurality of computer systems 700 that could operate independently can be generated. As shown in FIG. 1, each computer system 700 may comprise a plurality of memory devices 112 and a plurality of logic circuits 122 that have the same three-dimensional wafer structural configuration. In other words, the memory device 112 and logic circuit 122 in each computer system 700 are respectively laid out in the memory crystal layer 110 and the logic circuit layer 120 in advance, and then a three-dimensional structural configuration is fabricated in the form of a wafer stacking. In the three-dimensional structural configuration, circuit wires between wafer sets would not need to occupy any extra area, and thousands of bonding pads 102 and 104 can be directly used as signal transmission paths. In this way, the performance issue of data transferring can be effectively solved, thereby realizing the computer system 700 of the present disclosure.

Figure 2:
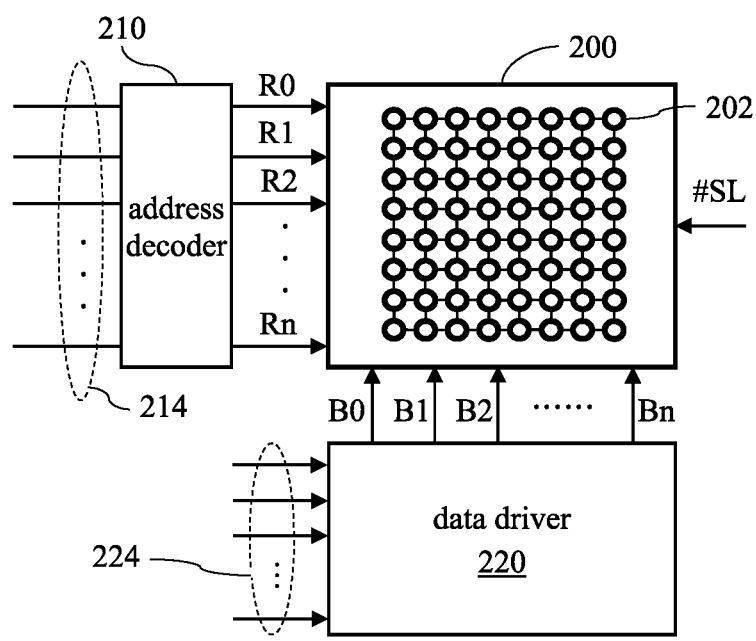
FIG. 2 is an embodiment of a memory device of the present disclosure.

FIG. 2 is an embodiment of a memory device of the present disclosure. The memory device 112 of the present disclosure is disposed on the memory-dedicated memory crystal layer 110 and can be manufactured in a modular form that, each memory device 112 can comprise a plurality of memory arrays 200, or called a memory matrix (BANK). The operation of each memory matrix can be controlled by an array selection signal #SL. Each memory array 200 mainly comprises a plurality of memory cells 202. The memory cells 202 are arranged in a plurality of rows and columns, each column shares an address line, and receives address signals numbered R0 to Rn. Each row shares a data line and transmits data signals numbered B0 to Bn. In other words, each shared circuit path is correspondingly connected to one row or one column of the memory cells 202. The memory unit 202 refers to a basic unit for storing bit information, which is usually activated under the control of an address signal, and read or written under the control of a data signal. The address lines are connected to an address decoder 210 for transmitting address signals 214 generated by the address decoder, so that the selected one or more columns of memory cells 202 are activated. The data lines are connected to a data driver 220 for transferring data written or read from the memory unit 202. The architecture disclosed in FIG. 2 is only an example, where in actual production, the number of the memory array 200, the address decoder 210, and the data driver 220 is not limited to one, and their connecting is not limited to one-to-one, or multiple-to-multiple relationship. Thus, the address decoder 210 and the data driver 220 in the memory device are a line driver. The connected data lines and address lines are shared circuit paths, which drive a plurality of memory cells 202 in a mesh-type interweaving manner.

Figure 3A:
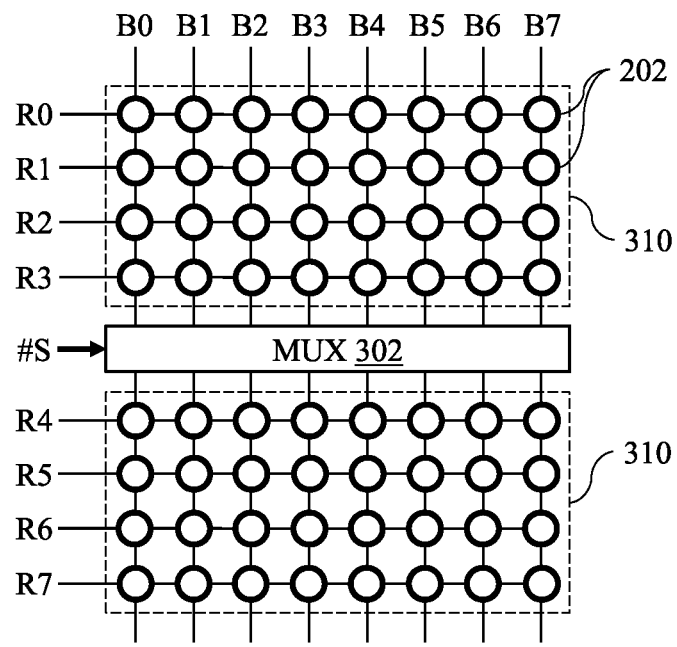
FIG. 3A to 3C are embodiments of a memory array and a multiplexer of the present disclosure.
Figure 3B:
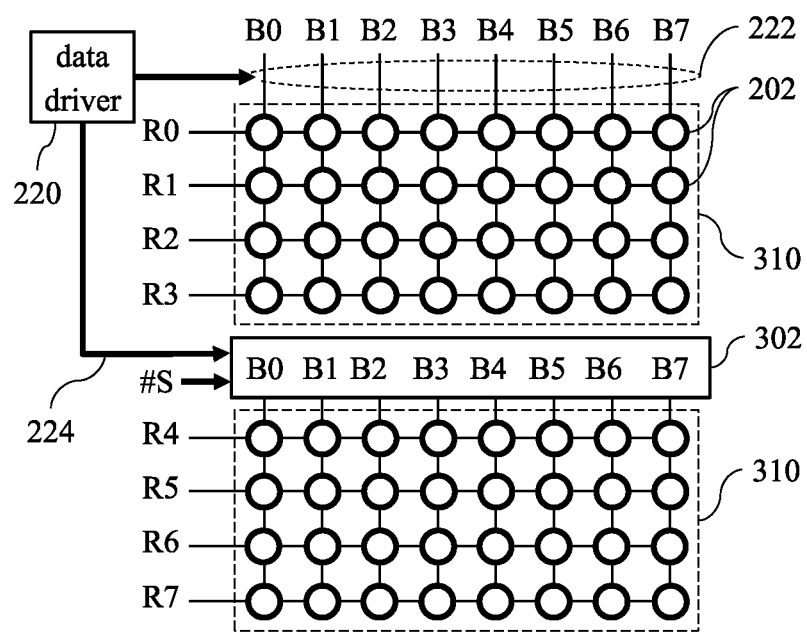
Figure 3C:
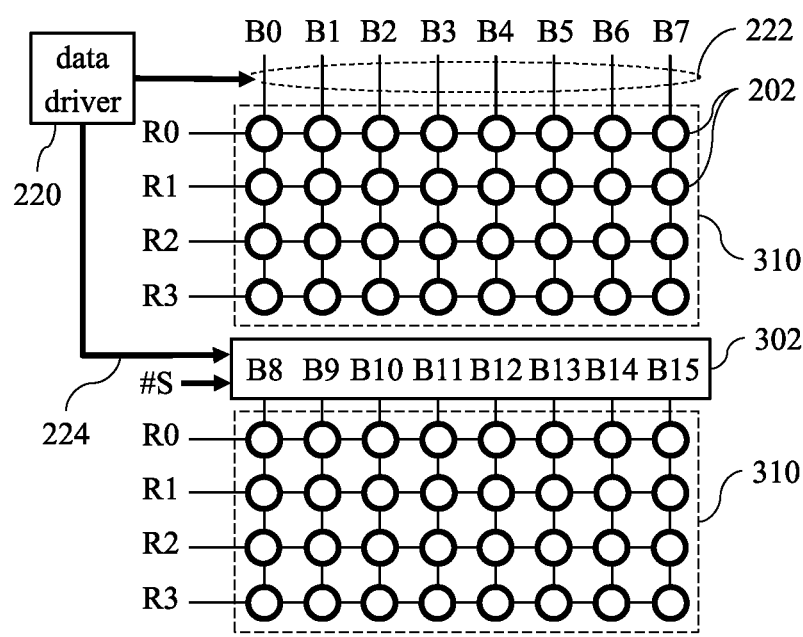

FIG. 3A to FIG. 3C are embodiments of a memory array 200 and a multiplexer (MUX) 302 of the present disclosure. To dynamically adjust the latency characteristics, a plurality of multiplexers 302 are disposed in each of the memory arrays 200 in this embodiment. Each of the multiplexers 302 is separated from others by a specified number of rows or columns. The multiplexers 302 can define a memory array 200 as a plurality of memory regions 310, each of which comprises a specific number of rows or columns of memory cells 202. Taking FIG. 3A as an example, a multiplexer 302 is disposed at a position adjacent to two memory regions 310.

FIG. 3B shows the operation of the multiplexer 302 when it is activated. The multiplexer 302 is connected to the data driver 220 through a dedicated line 224. When a control signal #S is transmitted from the logic circuit layer 120 shown in FIG. 1 to the multiplexer through one of the bonding pads 102, the shared data line 222 would be segmented at the position of the multiplexer 302, and an upper memory region and a lower memory region 310 would no longer share the same data line 222. The data line 222 is segmented into a first line segment in an upper memory region 310 and a second line segment in a lower memory region 310. In this embodiment, the upper memory region 310 could continue to receive the original data signals B0 to B7. However, since the number of memory cells shared on the first line segment is reduced, the capacitive load is significantly reduced, so the latency time of the memory region 310 can be effectively shortened, which is, the response speed can be accelerated. The multiplexer 302 reconnects the second line segment of the lower memory region 310 to the dedicated line 224 so that the lower memory region 310 continues to be controlled by the data driver 220. For example, the multiplexer 302 continues to receive data signals numbered B0 to B7 from the data driver 220 through the dedicated line 224. Since there are fewer memory cells 202 shared on the second line segment than the originals, the latency can also be reduced.

FIG. 3C shows another specific embodiment when the multiplexer 302 is activated. In this embodiment, in addition to the latency characteristics of the memory array 200 can be changed, the dimensions of the memory array 200 can also be changed. The sub-array is also formed by segmenting the shared data line 222 into two short parts, an upper part, and a lower part. In other words, since the data line 222 is originally connected to a plurality of memory cells 202 in series, after being segmented into two segments, two sub-arrays are logically formed. The memory region 310 corresponding to the first line segment forms a first sub-array, and the memory region 310 corresponding to the second line segment forms a second sub-array. When the multiplexer 302 is activated, since the shared data line 222 is segmented, the second sub-array would no longer share the shared data line 222 of the first sub-array. Instead, a dedicated line 224 is additionally provided by the multiplexer 302 to transmit data signals to the memory cells 202 in the second sub-array. In this embodiment, through the improvement of the data driver 220, the data signals transmitted through the dedicated line 224 would no longer be numbered B0 to B7, but newly added B8 to B15. Furthermore, in this embodiment, through the improvement of the address decoder, the second sub-array can share the address lines of the first sub-array, or receive the same address signals R0 to R3 as the first sub-array.

That is, according to the control signal #S, the address decoder 230 allows the memory cells in the second sub-array to share the shared address lines of the first sub-array, or uses the same address signal to drive the first sub-array and the second sub-array synchronously. This approach is equivalent to changing the dimensions of the original memory array 200. Although this embodiment uses 8×8 as an example to illustrate the division and reorganization of the memory array 200, it should be understood that in actual manufacturing, the dimension of each of the memory arrays 200 could be a large-scale array having a capacity of 100 megabits.

Figure 4:
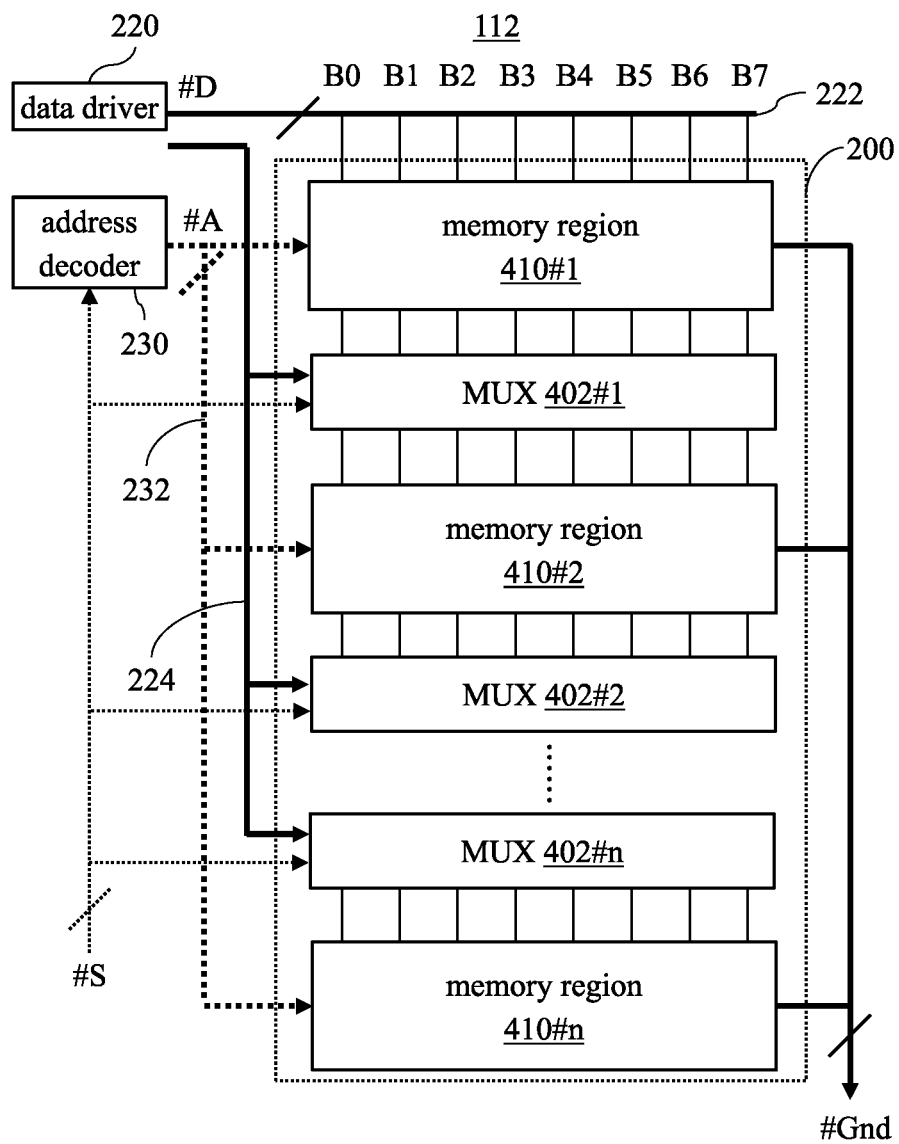
FIG. 4 is a further embodiment of the memory device 112 of the present disclosure.

FIG. 4 is a further embodiment of the memory device 112 of the present disclosure. A memory array 200 could comprise n multiplexers 402 #1 to 402 #n, which divide the memory array 200 into n memory regions 410 #1 to 410 #n. When the multiplexer is inactivated, the memory array 200 operates conventionally. In addition to transmitting data signals through the conventional shared data line 222, the data driver 220 also provides a plurality of dedicated lines 224 connected to the multiplexers 402 #1 to 402 #n. The memory device 112 further comprises an address decoder 230 that transmits the address signal #A to each of the memory regions 410 #1 to 410 #n through the address line 232. Although the data line 222 and the address line 232 are represented by a single line, it is understood that in practice, a plurality of lines may be included, respectively connecting each row or column in the memory array. Similar to the conventional design, each of the memory cells in the memory array 200 is commonly connected to a reference voltage or a ground line #Gnd.

Practically, each of the multiplexers may receive a control signal #S to determine whether to activate or not. For example, the control signal #S can be a value of the power of two, i.e. 2, 4, 8, or 16, etc. that instructs the multiplexers 402 #1 to 402 #n to divide the memory array 200 into a corresponding number of sub-arrays. When the control signal #S is 2, it means that a multiplexer is required to equally divide the memory array 200 into two sub-arrays. At this time, the multiplexer numbered n/2 in the memory array 200 can be activated in response to the control signal to achieve this purpose. Similarly, when the value of the control signal #S is 4, three multiplexers are required to equally divide the memory array 200 into four sub-arrays. At this time, in the memory array 200, the multiplexers numbered n/4, 2n/4, and 3n/4 can be activated in response to the control signal #S to divide into four sub-arrays. In this method, the value of n can be preset as a power of two for the implementation of the above division method.

In another embodiment, the control signal #S can also be used to determine every few memory regions to be divided. For example, when the value of control signal #S is 1, it means that each memory region needs to be independent, that is, all the multiplexers 402 #1 to 402 #n would be activated, so that the memory array 200 would become n sub-arrays, and each sub-array comprises a memory region.

When the value of the control signal #S is 2, it means that the memory array 200 needs to be divided into a group of two memory regions. Thus, the multiplexers with numbers 2, 4, 6, 8, etc., which are divisible by 2, are activated in response to the control signal, so that the memory array would become n/2 sub-arrays, and each sub-array comprises two memory regions.

In a further embodiment, the dividing of the memory array 200 may be more flexible. For example, each multiplexer could receive specific control signals different from others to determine whether to activate or not. Thus, the division possibilities that can be generated are not limited to the above-described embodiments.

In the embodiment of FIG. 4, the data driver 220 and the address decoder 230 can be further improved. Based on the division of the control signal #S, the data signal provided to each memory region may be changed, or the address signal provided to each memory region may be changed. This approach, as described in the embodiment shown in FIG. 3C, enables the memory array 200 to logically change the length and width dimensions dynamically.

Figure 5A:
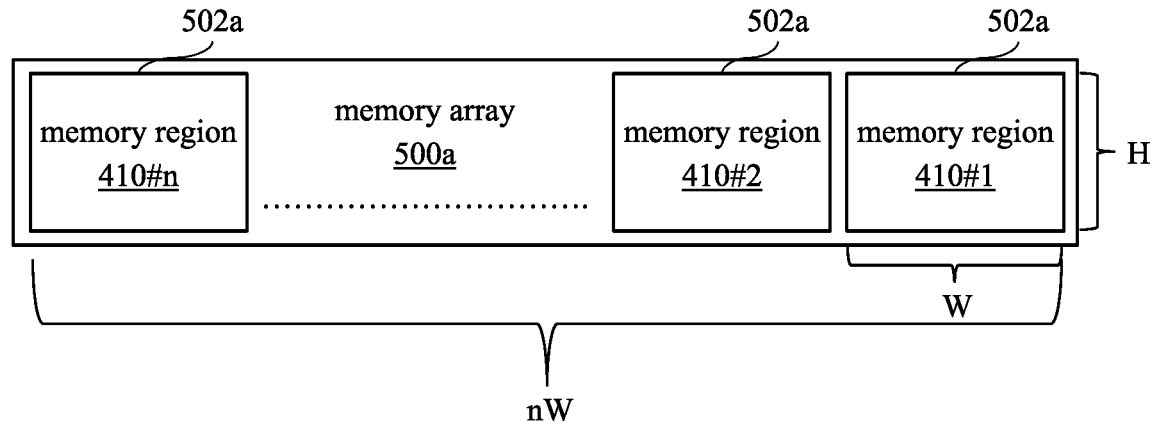
FIG. 5A to 5B are embodiments of various memory arrays of the present disclosure.
Figure 5B:
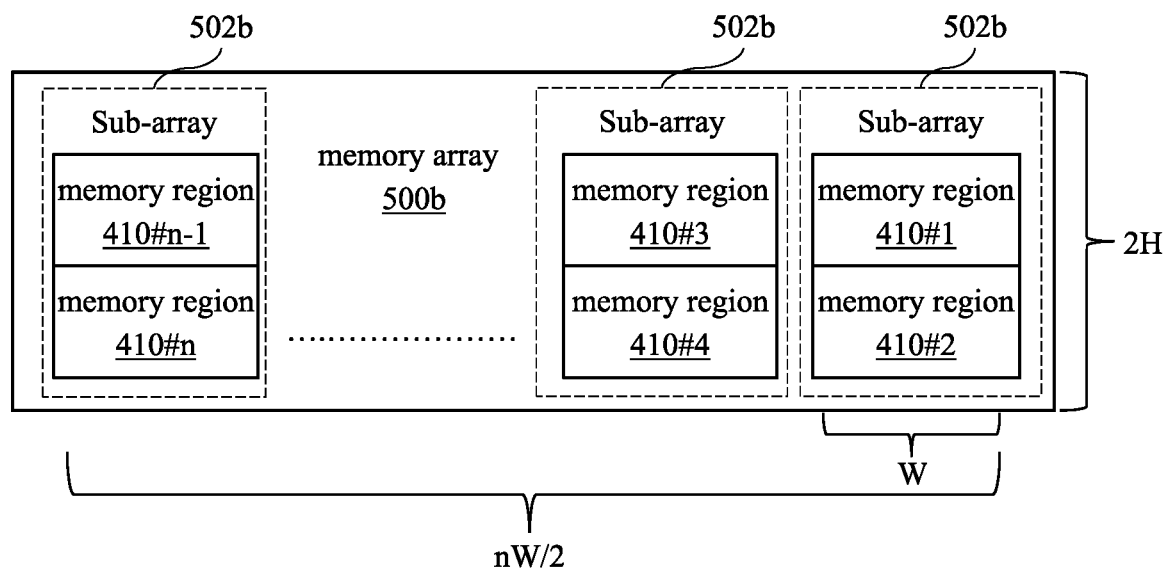

FIG. 5A to FIG. 5B are embodiments of various memory arrays of the present disclosure. FIG. 5A shows a memory array 500a generated when the memory array 200 of FIG. 4 is divided and recombined by a multiplexer. Each of the memory regions 410 #1 to 410 #n originally comprises W rows of memory cells (width) and H columns of address lines (height). After dimensional reorganization, a memory array 500a comprising a plurality of sub-arrays 502a is formed, where all the sub-arrays 502a share the H columns of address lines, and the bit width is extended to nW rows. This means that the multiplexer needs to provide dedicated lines for nW rows of memory cells to connect to the data drivers, i.e. nW dedicated lines. With the support of the wafer stacking technology, the technical difficulty of implementation can be easily overcome. In the embodiment of FIG. 5A, the original memory array dimension may be nH*W, which is reorganized to H*nW here. Thus, when the data lines of each row of memory cells are driven, the capacitive load that needs to be overcome becomes n times smaller, so that the response speed of the memory cells becomes faster.

FIG. 5B shows the memory array 500b generated when the memory array 200 of FIG. 4 is divided and recombined by the multiplexer. Each of the memory regions 410 #1 to 410 #n originally comprises W rows of memory cells (width) and H columns of address lines (height). The dimensions are reorganized here by activating a multiplexer every two memory blocks to form a memory array 500b including a plurality of sub-arrays 502b. Each of the sub-arrays 502b comprises two memory regions, with 2H columns high and W rows wide. The sub-arrays 502a in the memory array 500b share 2H column address lines. More precisely, through the improvement of the address decoder 230, all the memory sub-arrays 502b can share the same address lines, or the address decoder 230 can be transmitted to these memory sub-arrays according to the dividing of the memory array 500b flexibly. The bit width of the memory array 500b is extended to nW/2 rows. This means that the multiplexer needs to provide a corresponding number of dedicated lines for nW/2 row memory cells to the data driver. Comparing the embodiment of FIG. 5B with FIG. 5A, although the height (number of address columns) of the sub-array 502b is relatively greater and the latency time is not as much as that of the architecture shown in FIG. 5A, the number of dedicated lines required is relatively lesser. This shows that the architecture of this embodiment can be adjusted flexibly according to different demands.

Figure 6:
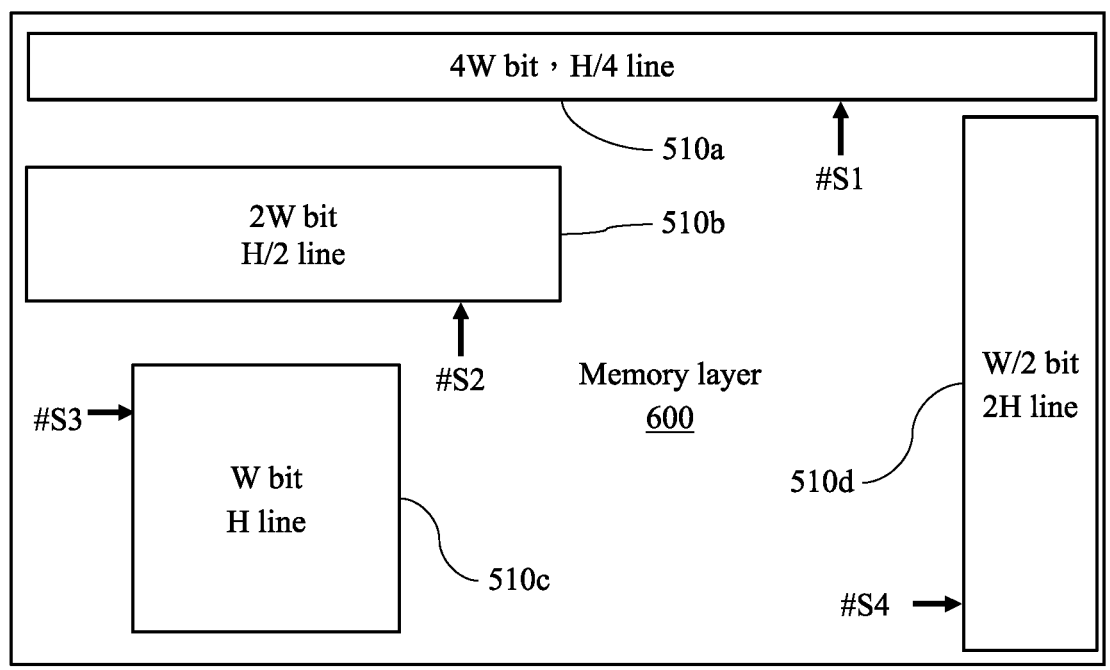
FIG. 6 is an embodiment of a memory layer 600 in the computer system 700 of the present disclosure.

FIG. 6 shows a further embodiment of a memory layer 600 in a computer system 700. Based on the concepts introduced in the foregoing embodiments, the memory layer 600 may be one of the regions of the computer system divided from the memory crystal layer 110 of FIG. 1 that comprises a plurality of memory devices 510a to 510d. Each of the memory devices 510a to 510d can apply a variety of different control signals to be configured with different latency characteristics. For example, a computer system 700 may preset the configuration for each memory device 510a to 510d in the firmware, and configure the memory devices 510a to 510d through the control signals #S1 to #S4 respectively when the system is booted, and then load the operating system. In a further case, the computer system 700 of the present disclosure can also be designed to allow dynamic and seamless changes to memory latency characteristics during operation. For example, when an application is loaded, the demand of the application for memory latency is determined, and a control signal is dynamically transmitted to change the dimensions of the memory devices to change the latency characteristics.

Figure 7:
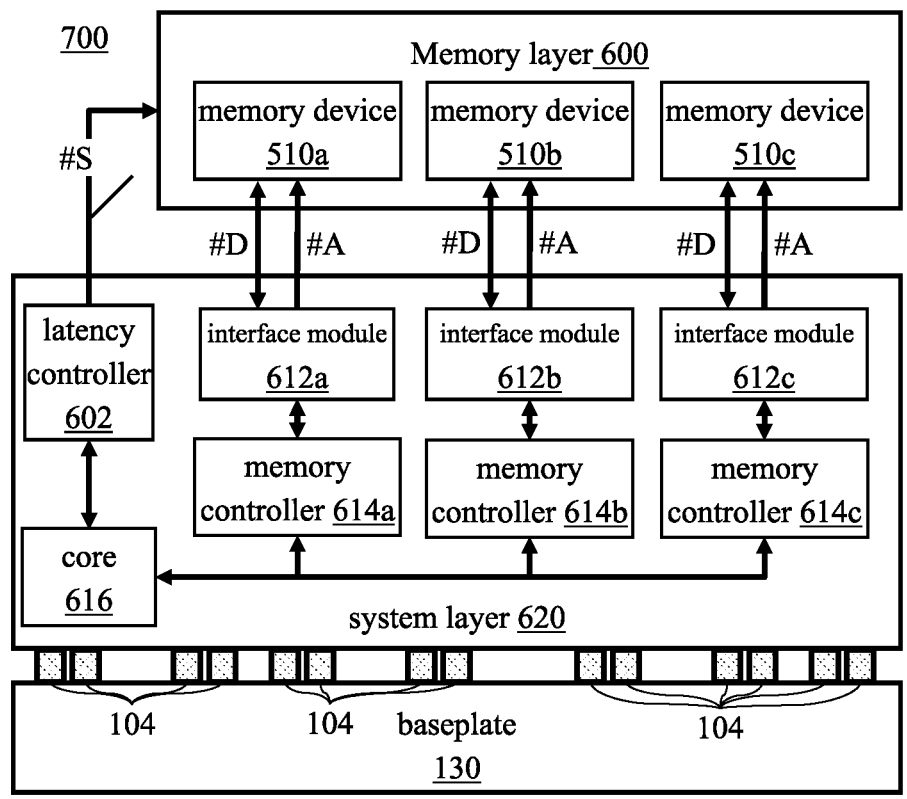
FIG. 7 is a further embodiment of the computer system of the present disclosure.

FIG. 7 is a further embodiment of a computer system 700 of the present disclosure. In the three-dimensional wafer product 100 shown in FIG. 1, when the wafer stacking process is completed, a plurality of computer systems 700 can be formed by further wafer dicing process. In memory layer 600 as shown in the figure, which are memory devices 510a-510c configured according to the embodiment of FIG. 6. A system layer 620 is stacked with the memory layer 600. The system layer 620 is divided from the logic circuit layer 120 of FIG. 1, which comprises logic circuits necessary for various computer architectures, such as a core 616 and the memory controllers 614a to 614c. Each of the memory controllers 614a to 614c is connected to each of the memory devices 510a to 510c in the memory layer 600 through an interface module 612a to 612c. An interface module is an interface specially designed to ensure data transmission, commonly known as the physical layer interface (PHY). Similar to FIG. 1, signals are communicated between the stack of memory layers 600 and system layers 620 through a plurality of bonding pads (not shown). The system layer 620 is also secured to the baseplate 130 through the plurality of bonding pads 104. In addition to providing basic support, the baseplate 130 can also provide additional wiring space. The memory controllers 614a-614c can provide the address signal #A to the memory devices 510a-510c through the interface modules 612a-612c and bonding pads to access the data signal #D. The architecture of the computer system 700 is only an example. The configured quantity of the memory controller, interface module, and the memory device is not limited to three groups. The core 616 may be a multi-core architecture.

In the computer system 700 of FIG. 7, a latency controller 602 is configured, which is connected to the memory layer 600 through one or more bonding pads to transmit the control signal #S to the memory devices 510a to 510c. As described in the foregoing embodiments, the memory devices 510a and 510c can flexibly adjust the number of memory cells connected to the shared circuit path in each memory array according to the control signal #S to dynamically change the latency characteristics of the memory array. The latency controller 602 may be controlled by the core 616. When the core 616 is performing an application, it can immediately determine the latency requirement of the application and can instruct the latency controller 602 to adjust the memory devices 510a to 510c. For example, enabling the memory array to change the dimension machine, each memory array can be divided into sub-arrays in the number of power of two, and then reorganized into new array dimensions that meet the conditions of the application. When performing the application, the core 616 can adaptively use the memory devices 510a-510c that meet the requirements of the application through the memory controllers 614a-614c.

Figure 8:
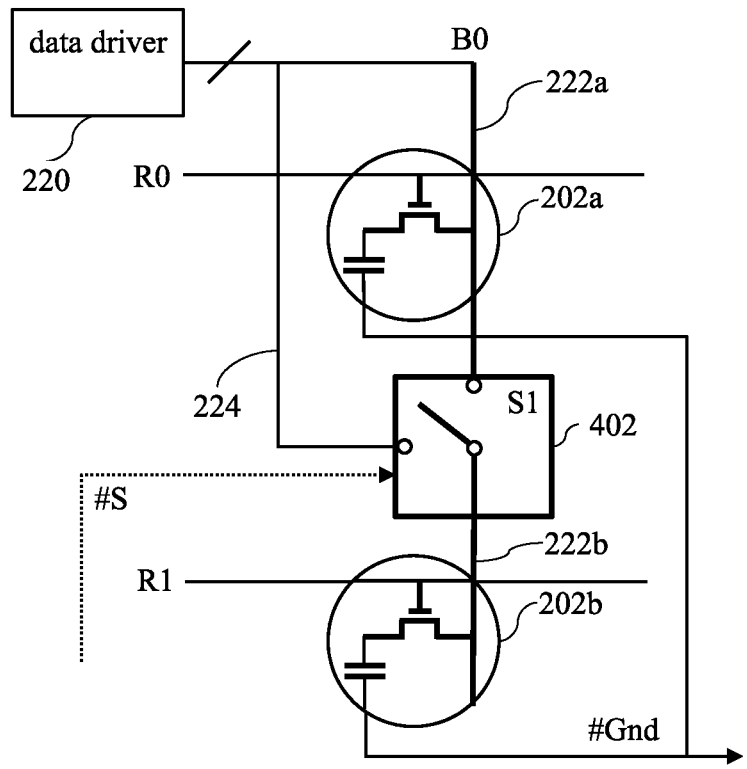
FIG. 8 is a further embodiment of the memory arrays and multiplexers of the present disclosure.

FIG. 8 is a further embodiment of the memory array and multiplexer of the present disclosure. The memory cells 202a and 202b are used to illustrate how the multiplexer 402 reduces the capacitive load on the data lines here. A basic logic in a memory cell is that a capacitor is controlled by a switch to be charged or discharged to represent a bit of data. The address lines transmitting the address signals R0 and R1 can be connected in series with the gates of the memory cells 202a and 202b. The data line for transmitting the data signal B0 is connected in series with one end of the switches of the memory cells 202a and 202b. When the multiplexer 402 is not activated, the first line segment 222a and the second line segment 222b of the data line are connected to form the same line segment, so that the memory cells 202a and 202b share the same data line to receive the data signal B0 and operate normally. When the multiplexer 402 is activated as instructed by the control signal #S, the switch in the multiplexer 402 segments the second line segment 222b from the first line segment 222a, and switches the second line segment 222b to a dedicated line. The dedicated line is connected to the data driver 220 so that the memory unit 202b can still receive data signals. Under this architecture, since the first line segment 222a and the second line segment 222b drive half the number of memory cells respectively, the latency effect caused by the load capacitance can be reduced, and the response speed of the memory can be improved. Although this embodiment is only described with one row and two columns of memory cells, it should be understood that the actual number of multiplexers 402 could be multiple that are inserted inbetween multiple columns in a memory array and simultaneously controls the sharing and segmentation of the plurality of data lines. The data signal transmitted on the dedicated line 224 is not limited to be the same as the data signal of the first line segment 222a. The data driver 220 can also be modified so that memory cells 202a and 202b could receive different data signals after segmentation. Correspondingly, the address decoder can also be modified, so that the address lines originally transmitting the address signals R0 and R1 respectively share the same address signal after the multiplexer 402 is activated, for example, R0, which enables both memory cells 202a and 202b to be activated at the same time. In this case, memory cells 202a and 202b can logically be referred as different bits on the same column. That is, the width and height dimensions of the memory array are changed from the original 1*2 to 2*1. This architecture has a significant effect on elastically adapting to different latency requirements. The actual circuit structural configuration of the above-mentioned memory units 202a and 202b already exist in the prior art, so this embodiment is only for illustration and does not limit the detailed implementation.

Figure 9:
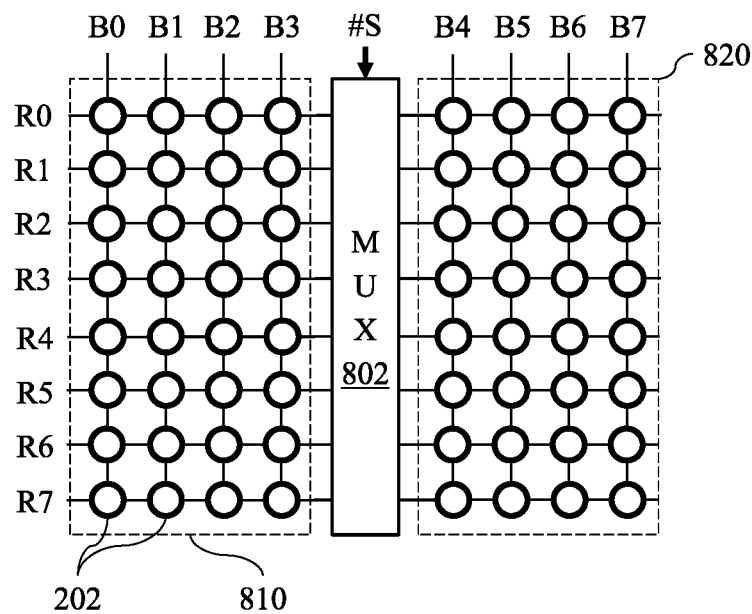
FIG. 9 is another embodiment of the memory arrays and multiplexers of the present disclosure.

FIG. 9 shows an embodiment in which a multiplexer is provided on the address lines. The foregoing embodiments mainly describe how to shorten the shared data line. However, embodiments of the present disclosure may also proceed from address lines. The way of changing the dimensions of the memory array, i.e. the way of forming the sub-arrays 810 and 820, can also break the shared address line into two shorter address lines. In this case, a plurality of shared address lines could transmit address signals R0 to R7 of the memory cells 202. After the multiplexer 802 is activated after receiving the control signal #S, the plurality of disconnected address lines in the second sub-array 820 can be switched to dedicated lines for connection with the address decoder. Further, the data driver 220 and the address decoder 230 can also be modified. According to the control signal #S, the second sub-array 820 can share the shared data line of the first sub-array 810, or can use the same data signal to drive the first sub-array 810 and the second sub-array 820. Meanwhile, the second sub-array 820 could use a different address signal source from that of the first sub-array, such as R8 to R15 (not shown). In this way, it is logical to generate a new memory array, the dimension can be half of the original data bit number (array width), and the address line number (array height) can be doubled. In the method shown in FIG. 8, since the address lines are shortened, the driving load of the address lines can be reduced, which also has the effect of changing the latency characteristics of the memory array.

Figure 10:
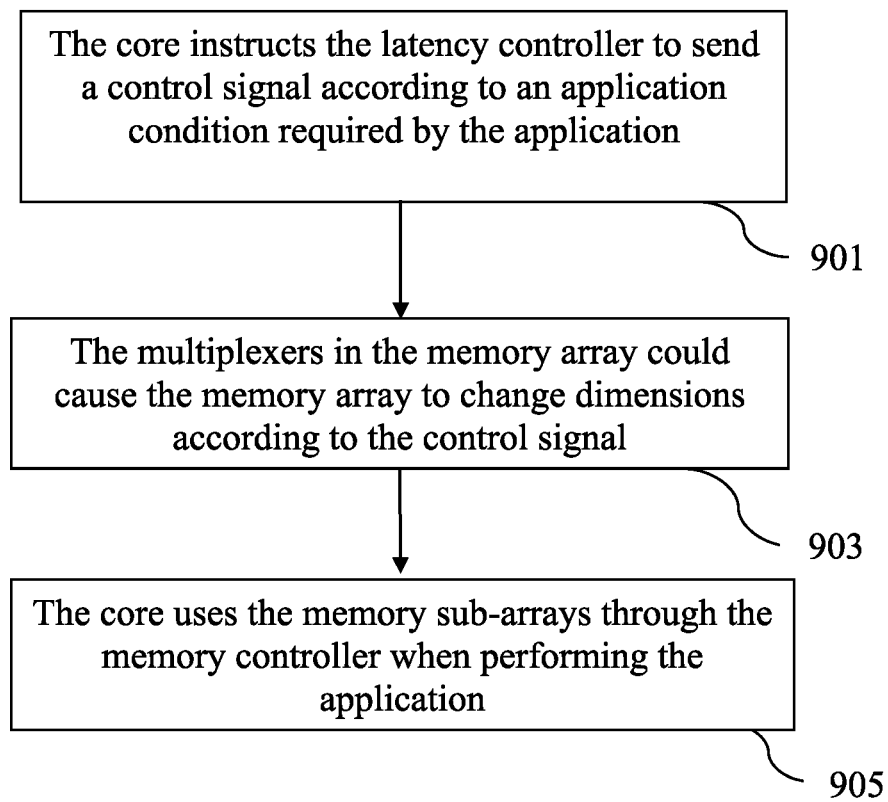
FIG. 10 is a flowchart of a memory control method of the present disclosure.

FIG. 10 is a flowchart of the memory control method of the present disclosure. The present disclosure further provides a memory control method, which is applied to the aforementioned computer system and the memory device. In step 901, when an application is performed by a core, the core would instruct the latency controller to send a control signal according to an application condition required by the application. In step 903, the multiplexers in the memory array could cause the memory array to change dimensions according to the control signal. For example, the memory array can be divided into two or more sub-arrays that meet the conditions of the application. In step 905, the core uses the memory sub-arrays through the memory controller when performing the application.

In summary, based on the wafer stacking technology, embodiments of the present disclosure provide a memory architecture that can flexibly adjust the dimensions of the array, so that the blockchain server product can adapt to the needs of future algorithms.

It is to be understood that the term "comprises", "comprising", or any other variants thereof, is intended to encompass a non-exclusive inclusion, such that a process, method, article, or device of a series of elements not only comprise those elements but further comprises other elements that are not explicitly listed, or elements that are inherent to such a process, method, article, or device. An element defined by the phrase "comprising a . . . " does not exclude the presence of the same element in the process, method, article, or device that comprises the element.

Although the present disclosure has been explained in relation to its preferred embodiment, it does not intend to limit the present disclosure. It will be apparent to those skilled in the art having regard to this present disclosure that other modifications of the exemplary embodiments beyond those embodiments specifically described here may be made without departing from the spirit of the disclosure. Accordingly, such modifications are considered within the scope of the disclosure as limited solely by the appended claims.

What is claimed is:

1. A computer system, comprising:
a first wafer comprising a plurality of memory devices, one of the memory devices comprising:
a memory array comprising a shared circuit path, a plurality of memory cells, a plurality of memory regions and a plurality of multiplexers, the shared circuit path being connected to the memory cells, each memory region comprises a specific number of rows or columns of memory cells and each multiplexer being disposed at a position where one the memory regions is adjacent to another; and
a line driver connected to the shared circuit path for driving the memory cells of one memory region, and connected to a dedicated line for each multiplexer to drive the memory cells of another memory region; and
a second wafer stacked with the first wafer, the second wafer comprising:
a plurality of bonding pads for signal transmission; and
a latency controller connected to the memory array through the bonding pads for adjusting the number of memory cells connected to the shared circuit path to dynamically change the characteristic of latency of the memory array; wherein:
when the latency controller transmits a control signal through one of the bonding pads to activate one of the multiplexers, the shared circuit path is disconnected to form a first line segment and a second line segment, and the second line segment is connected to the dedicated line;
a memory region corresponding to the first line segment forms a first sub-array;
a memory region corresponding to the second line segment forms a second sub-array.

2. The computer system according to claim 1, wherein:
the line driver comprises a data driver;
the shared circuit path comprises a plurality of shared data lines, by each of which the data driver is connected to a corresponding row of memory cells among the memory cells for data signal transmission; and
a memory cell in the second sub-array transmits a data signal with the dedicated line when the multiplexer is activated.

3. The computer system according to claim 2, wherein:
the line driver comprises an address decoder;
the memory device further comprises a plurality of shared address lines, each of which is connected to the address decoder and a corresponding column of memory cells among the memory cells for address signal transmission; and
when the multiplexer is activated, the address decoder enables the shared address lines corresponding to the number of columns in the second sub-array and in the first sub-array to receive the same address signals based on the control signal.

4. The computer system according to claim 1, wherein the second wafer further comprises:
a memory controller coupled to the memory array through the bonding pads; and
a core connected to the memory controller and the latency controller for performing an application; wherein:
the core sets the multiplexers in the memory array through the latency controller based on an application condition required by the application, to divide the memory array into two or more memory sub-arrays that meet the conditions of the application and use the memory sub-arrays through the memory controller when the application is executed.

5. The computer system according to claim 4, wherein:
the application condition comprises a response time required by the application; and
the shorter the required reaction time, the more multiplexers the latency controller would activate.

6. A memory control method, applied to the computer system according to claim 4, comprising:
performing an application;
the core setting the multiplexers in the memory array through the latency controller based on an application condition required by the application to divide the memory array into two or more memory sub-arrays that meet the conditions of the application and use the memory sub-arrays through the memory controller when the application is executed, wherein:
the application condition comprises a response time required by the application.

7. A memory device configured in a first wafer stacked with a second wafer to form a computer system, comprising:
a memory array comprising a shared circuit path, a plurality of memory cells, a plurality of memory regions and a plurality of multiplexers, the shared circuit path being connected to the memory cells, each of memory region comprising a specific number of rows or columns of memory cells and each of multiplexer being disposed at a position where one the memory regions is adjacent to another; and
a line driver connected to the shared circuit path for driving the memory cells of one memory region, and connected to a dedicated line for each multiplexer to drive the memory cells of another memory region;
wherein:
the first wafer receives a control signal transmitted by the second wafer to adjusts the number of memory cells connected to the shared circuit path for dynamically changing the latency characteristics of the memory array; wherein:
when one of the multiplexers is activated by the control signal, the shared circuit path is disconnected to form a first line segment and a second line segment, and the second line segment is connected to the dedicated line;
a memory region corresponding to the first line segment forms a first sub-array; and
a memory region corresponding to the second line segment forms a second sub-array.

8. The memory device according to claim 7, wherein:
the line driver comprises a data driver;
the shared circuit path comprises a plurality of shared data lines, by each of which the data driver is connected to a corresponding row of memory cells among the memory cells for data signal transmission; and
a memory cell in the second sub-array transmits a data signal with the dedicated line when the multiplexer is activated.

9. The memory device according to claim 7, wherein:
the line driver comprises an address decoder;
the memory device further comprises a plurality of shared address lines, each of which is connected to the address decoder and a corresponding column of memory cells among the memory cells for address signal transmission; and
when the multiplexer is activated, the address decoder enables the shared address lines corresponding to the number of columns in the second sub-array and in the first sub-array to receive the same address signals based on the control signal.

10. The memory device according to claim 7, wherein:
the control signal is generated according to an application condition when the computer system executes an application, enabling the multiplexers to divide the memory array to form two or more memory sub-arrays that meet the requirements for the application condition for the application to access.

11. The memory device according to claim 10, wherein:
the application condition includes a response time required by the application.

* * * * *